US009966272B1

(12) United States Patent
Sheng et al.

(10) Patent No.: US 9,966,272 B1
(45) Date of Patent: May 8, 2018

(54) METHODS FOR NITRIDE PLANARIZATION USING DIELECTRIC

(71) Applicant: GLOBALFOUNDRIES INC., Grand Cayman (KY)

(72) Inventors: Haifeng Sheng, Rexford, NY (US); Haigou Huang, Rexford, NY (US); Tai Fong Chao, Clifton Park, NY (US); Jiehui Shu, Clifton Park, NY (US); Jinping Liu, Ballston Lake, NY (US); Xingzhao Shi, Clifton Park, NY (US); Laertis Economikos, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days. days.

(21) Appl. No.: 15/632,931

(22) Filed: Jun. 26, 2017

(51) Int. Cl.
*H01L 21/00* (2006.01)
*H01L 21/3105* (2006.01)

(52) U.S. Cl.
CPC .............................. *H01L 21/31056* (2013.01)

(58) Field of Classification Search
CPC ......... H01L 21/31056; H01L 29/66795; H01L 29/785; H01L 27/0886; H01L 21/823821; H01L 21/845
See application file for complete search history.

(56) References Cited

U.S. PATENT DOCUMENTS

| 9,812,530 | B2* | 11/2017 | Balakrishnan ........ H01L 29/161 |
| 9,842,931 | B1* | 12/2017 | Anderson ............. H01L 29/785 |
| 2005/0153492 | A1* | 7/2005 | Ahmed ............. H01L 29/66545 |
| | | | 438/183 |

* cited by examiner

Primary Examiner — Richard Booth
(74) *Attorney, Agent, or Firm* — Francois Pagette; Hoffman Warnick LLC (57) ABSTRACT

The disclosure is directed to methods of planarizing an integrated circuit structure including: forming a dielectric over a first nitride layer; planarizing the dielectric to a top surface of a set of nitride fins in a first region and removing the dielectric from a second region to expose the substantially planar upper surface in a second region; forming a second nitride layer over the dielectric and the top surface of the set of nitride fins and over the substantially planar upper surface; planarizing the second nitride layer such that the second nitride layer in the second region is planar with the top surface of the dielectric and the set of nitride fins, and such that the second nitride layer is removed from the first region; and performing an etch such that the first nitride layer in the first region is planar with the first nitride layer in the second region.

19 Claims, 5 Drawing Sheets

METHODS FOR NITRIDE PLANARIZATION USING DIELECTRIC

BACKGROUND

Technical Field

The present disclosure relates to methods for planarizing integrated circuit structures, and more specifically, methods for planarizing nitride layers using a dielectric.

Related Art

As integrated circuit (IC) structures continue scale down, e.g., 7 nanometer (nm) and beyond, real estate on the IC structure becomes more valuable. With respect to the structures of a field effect transistor (FET), the gate height is of particular importance. During the formation of nitride cap layers over gate structures, one or more "bumps" or nitride fins may be formed within the nitride cap layer. Specifically, during the lithography used to define p-type FET (PFET) and n-type FET (NFET) regions, nitride fins may be formed between adjacent PFET and NFET regions. As a result, regions within the IC structures have non-planar or uneven nitride surfaces which result non-uniform gate heights.

SUMMARY

A first aspect of the disclosure is directed to a method of planarizing an integrated circuit structure. The method may include: forming a dielectric over a first nitride layer that is disposed over a substrate, the first nitride layer having a first region including a set of nitride fins and a second region having a substantially planar upper surface; planarizing the dielectric to a top surface of the set of nitride fins in the first region and removing the dielectric from the second region to expose the substantially planar upper surface in the second region; forming a second nitride layer over the dielectric and the top surface of the set of nitride fins in the first region and over the substantially planar upper surface in the second region; planarizing the second nitride layer such that the second nitride layer in the second region is planar with the top surface of the dielectric and the set of nitride fins that are disposed in the first region, and such that the second nitride layer is removed from the first region; and performing an etch such that the first nitride layer in the first region is planar with the first nitride layer in the second region.

A second aspect of the disclosure is directed to a method of planarizing an integrated circuit structure. The method may include: forming a dielectric over a first nitride layer that is disposed over a substrate, the first nitride layer having a first region including a set of nitride fins and a second region having a substantially planar upper surface; planarizing the dielectric with the set of nitride fins such that the dielectric is removed from the second region and remains disposed between the nitride fins of the set of nitride fins in the first region; forming a second nitride layer over the set of nitride fins and the dielectric in the first region and over the substantially planar upper surface in the second region; planarizing the second nitride layer to the set of nitride fins thereby removing the second nitride layer from the first region; and performing an etch to remove the set of nitride fins and the dielectric from the first region and to remove the second nitride layer from the second region such that the first nitride layer in the first region is substantially planar with the first nitride layer in the second region.

A third aspect of the disclosure is directed to a method of planarizing an integrated circuit structure. The method may include: forming a dielectric over a first nitride layer that is disposed over a substrate, the first nitride layer include a first region having a set of nitride fins and a second region having a substantially planar upper surface, wherein each fin in the set of nitride fins is disposed between a p-type field effect transistor (PFET) region of a substrate and an n-type field effect transistor (NFET) region of the substrate; planarizing the dielectric with the set of nitride fins such that the dielectric is removed from the second region and remains disposed between the nitride fins of the set of nitride fins in the first region; forming a second nitride layer over the set of nitride fins and the dielectric in the first region and over the substantially planar upper surface in the second region; planarizing the second nitride layer to the set of nitride fins thereby removing the second nitride layer from the first region; and performing an etch to remove the set of nitride fins and the dielectric from the first region and to remove the second nitride layer from the second region such that the first nitride layer in the first region is substantially planar with the first nitride layer in the second region.

The foregoing and other features of the disclosure will be apparent from the following more particular description of embodiments of the disclosure.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

During the formation of nitride cap layers over gate s or more "bumps" may be formed within the nitride cap layer. Specifically, during the lithography used to define p-type field effect transistor (PFET) and n-type field effect transistor (NFET) regions, nitride fins may be formed between adjacent PFET and NFET regions. FIGS. 1-4 show a conventional integrated circuit structure where this may occur.

Figure 1:
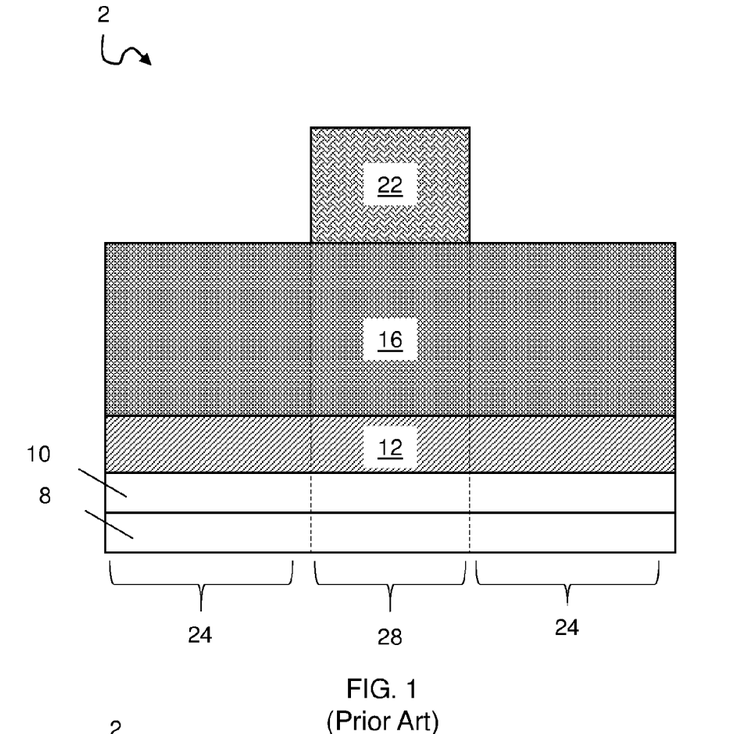
FIGS. 1-4 show cross-sectional views of an integrated circuit structure being formed according to conventional processes.
Figure 2:
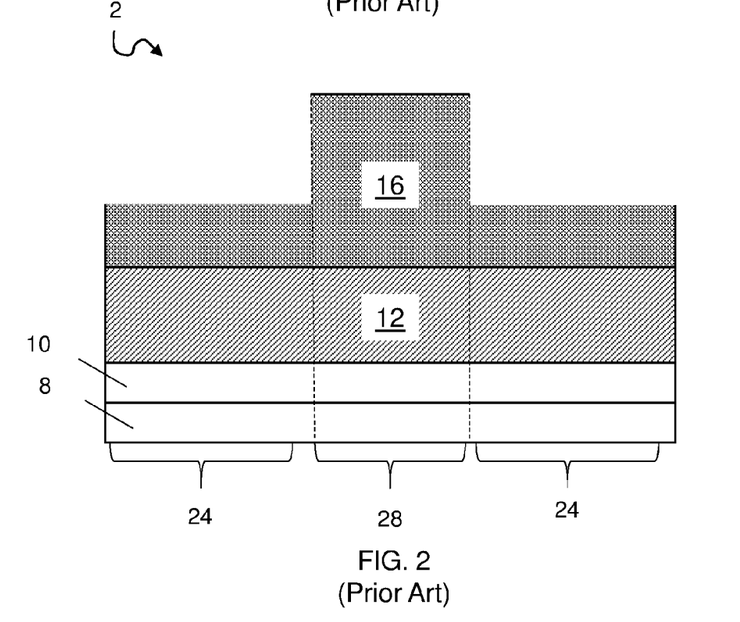

Referring to FIG. 1, an example of a conventional integrated circuit structure 2 is shown. Structure 2 may include a substrate 8, a set of fins 10 (one shown) over substrate 8, and a gate structure 12 over set of fins 8. Additionally, structure 2 may include a nitride layer 16 over gate structure 12. A first lithographic technique may be performed to remove portions of nitride layer 16 over the device regions 24 of a first type of structure 2, e.g., either NFET or PFET regions. More specifically, as shown in FIG. 1, a mask 22 may be formed over nitride layer 16, and etched such that mask 22 remains over device regions 28 of a second type of structure 2, e.g., the other one of PFET or NFET regions. As a result, nitride layer 16 over device regions 24 of the first type may be exposed. As shown in FIG. 2, an etching may be performed to recess exposed portions of nitride layer 16 over device regions 24. Because nitride layer 16 over device regions 28 are protected by mask 22, nitride layer 16 over device regions 28 are not recessed during this process.

Figure 3:
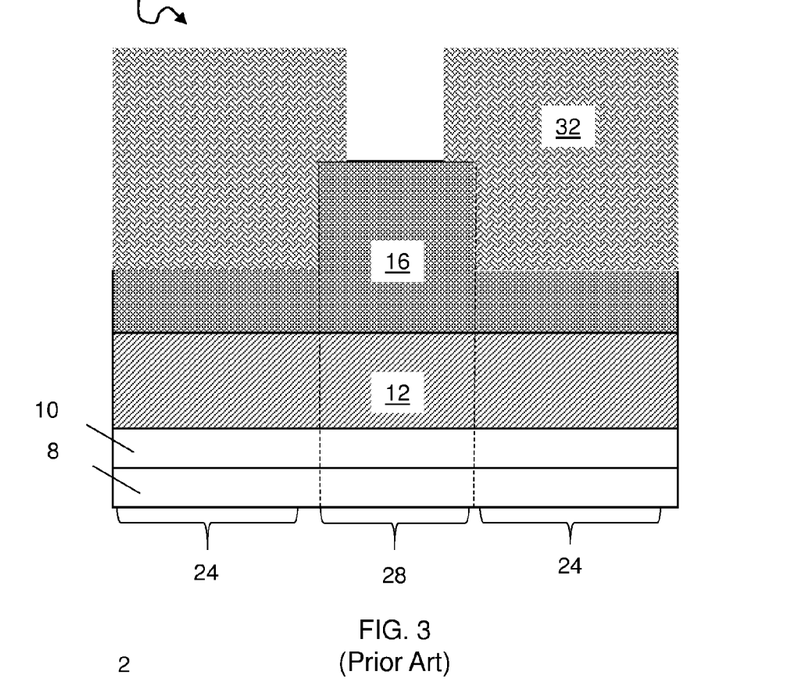
Figure 4:
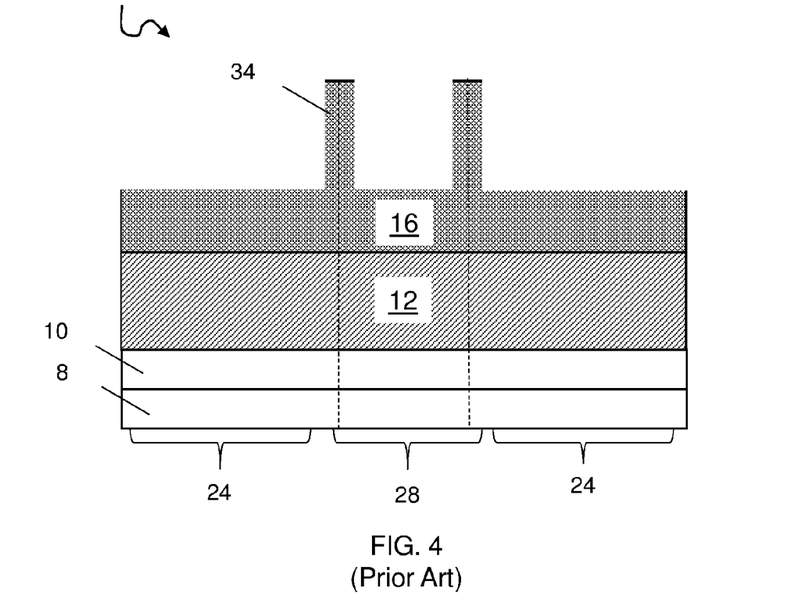

Turning now to FIGS. 3-4, a second lithography technique may be performed to remove portions of nitride layer 16 over the other device regions 28 of structure 2 such that a set of nitride fins 34 (FIG. 4) remain between device regions 24, 28. More specifically, as shown in FIG. 3, a mask 32 may be formed over nitride layer 16, and patterned and etched such that mask 32 remains over device regions 24 of a first type of structure 2. As a result, nitride layer 16 over device regions 28 of the second type may be exposed. As shown FIG. 4, an etching may be performed to recess exposed portions of nitride layer 16 over device regions 28. Because nitride layer 16 over device regions 24 are protected by mask 32, some portions of nitride layer 16 over device regions 24 may not be recessed during this process. In order to ensure that all of the desired nitride layer 16 is recessed over each of the first and second device regions 24, 28, there may be some overlap in the masks 22, 32 used. As a result, a portion of nitride layer 16 may not be recessed and a set of nitride fins 34 or bumps may remain such that set of nitride fins 34 are formed in an overlap region of mask 22 (FIG. 1) used in the first lithography technique and mask 32 (FIG. 3) used in the second lithography technique. The present disclosure relates to methods for planarizing nitride layers using a dielectric in order to remove these nitride fins or bumps.

Figure 5:
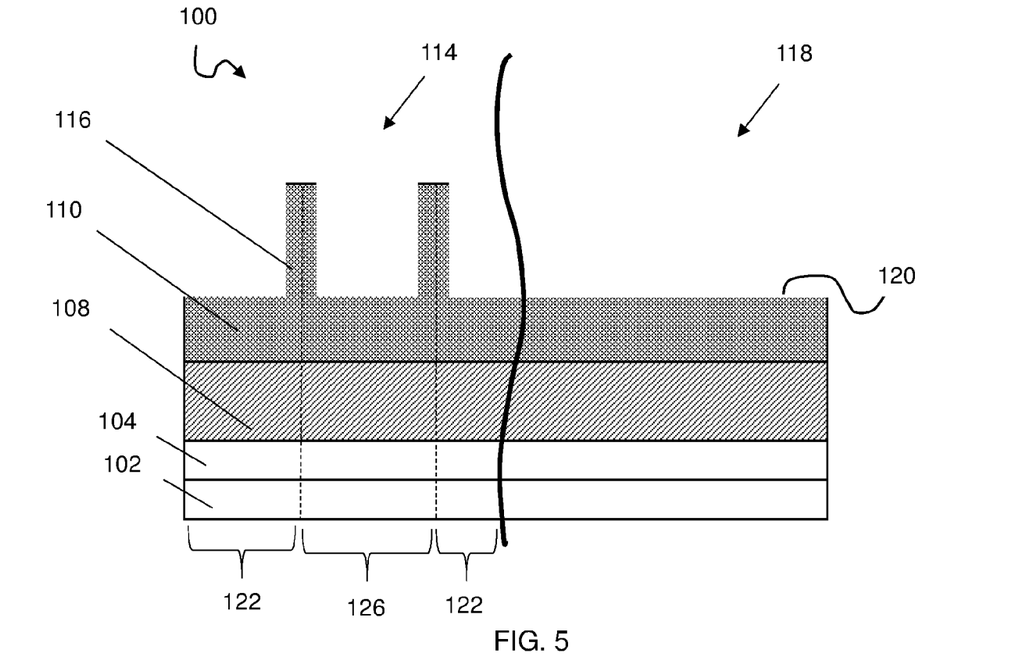
FIGS. 5-10 show cross-sectional views of an integrated circuit structure undergoing aspects of a method according to the disclosure.

FIG. 5 shows a preliminary IC structure 100 according to embodiments of the disclosure. IC structure 100 may include a substrate 102. Substrate 102 may include but is not limited to: silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entirety of substrate 102 may be strained. While substrate 102 is shown as including a single layer of semiconductor material, it is emphasized that the teachings of the disclosure are equally applicable to semiconductor-on-insulator (SOI) substrates. As known in the art, SOI substrates may include a semiconductor layer on an insulator layer on another semiconductor layer (not shown). The semiconductor layers of an SOI substrate may include any of the semiconductor substrate materials discussed herein. The insulator layer of the SOI substrate may include any now known or later developed SOI substrate insulator such as but not limited to silicon oxide.

Fins 104 (one shown) may be formed from substrate 102, e.g., by patterning a mask (not shown) and etching, such that fins 104 overlie a remaining portion of substrate 102. Where substrate 102 includes an SOI substrate, fins 104 may be formed from the upper semiconductor layer over the insulator layer. As used herein, "etching" generally refers to the removal of material from a substrate or structures formed on the substrate by wet or dry chemical means. In some instances, it may be desirable to selectively remove material from certain areas of the substrate. In such an instance, a mask may be used to prevent the removal of material from certain areas of the substrate. There are generally two categories of etching, (i) wet etch and (ii) dry etch. Wet etching may be used to selectively dissolve a given material and leave another material relatively intact. Wet etching is typically performed with a solvent, such as an acid. Dry etching may be performed using a plasma which may produce energetic free radicals, or species neutrally charged, that react or impinge at the surface of the wafer. Neutral particles may attack the wafer from all angles, and thus, this process is isotropic. Ion milling, or sputter etching, bombards the wafer with energetic ions of noble gases from a single direction, and thus, this process is highly anisotropic. A reactive-ion etch (RIE) operates under conditions intermediate between sputter etching and plasma etching and may be used to produce deep, narrow features, such as trenches.

A dummy gate structure 108 may be formed over fins 104. Dummy gate structure 108 may be formed perpendicular to and over fins 104 and over substrate 102. Dummy gate structure 108 may include any dummy gate material, e.g., polysilicon. Fins 104 may be doped and or an epitaxial layer can be grown thereon as known in the art to create source/drain terminals (not shown) on opposing side of gate structure 108.

As used herein, "depositing" may include any now known or later developed techniques appropriate for the material to be deposited including but are not limited to, for example: chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, evaporation.

A nitride layer 110 may be formed, e.g., deposited, over dummy gate structure 108. Nitride layer 110 may include, for example, silicon nitride. Nitride layer 110 may include a first region 114 including a set of nitride fins 116 and a second region 118 having a substantially planar upper surface 120. Each fin in set of nitride fins 116 may be disposed between a PFET region (device region 122 or device region 126) of substrate 102 and an NFET region (the other device region 122, 126) of substrate 102. That is, first region 114 may define a region where both PFET and NFET devices are formed, e.g., a complementary metal-oxide-semiconductor (CMOS) device region. Second region 118 of nitride layer 110 may be positioned elsewhere on IC structure 100 and separated from first region 114. Second region 118 may define a region where one type of device, such as a PFET or NFET, is formed, e.g., a unipolar device region. IC structure 100 may otherwise be formed, e.g., as described relative to FIGS. 1-4.

Figure 6:
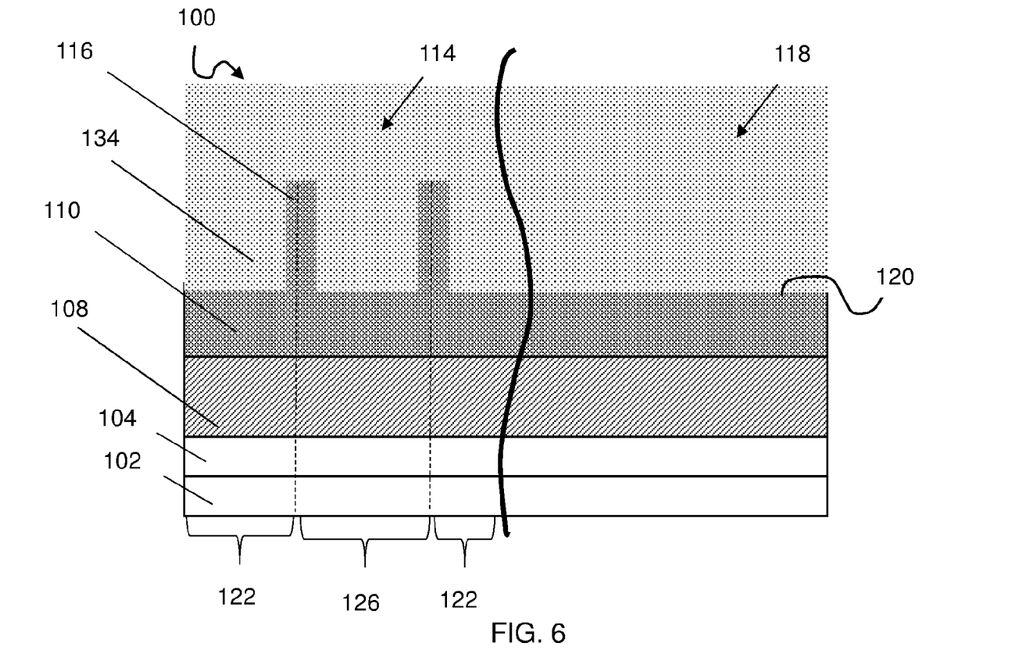
Figure 7:
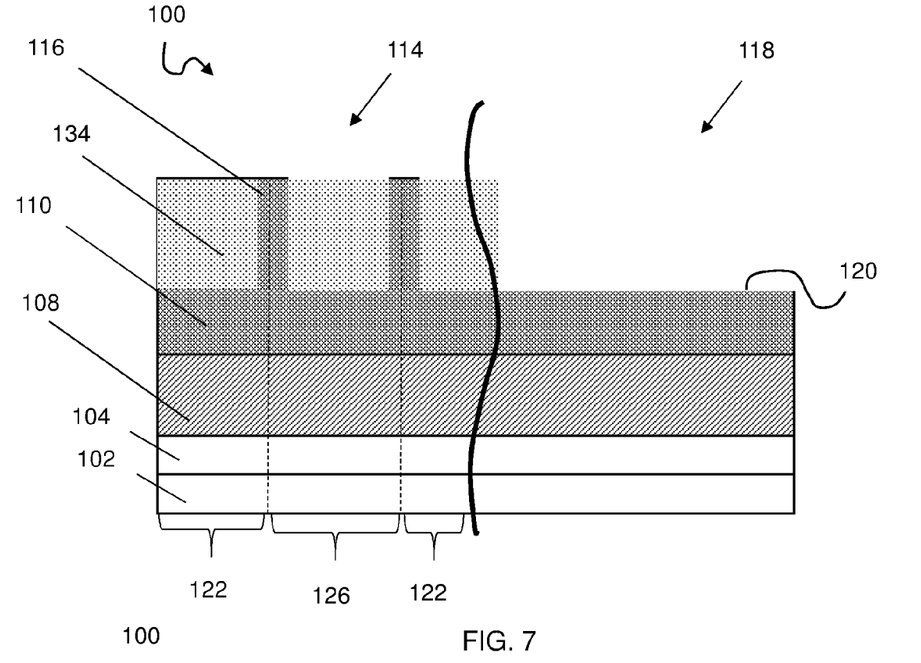

Turning now to FIG. 6, a dielectric 134 may be formed, e.g., deposited, over nitride layer 116 including over nitride fins 116 in first region 114. Dielectric 134 may be formed such that dielectric 134 is formed to a height greater than set of nitride fins 116. Additionally, dielectric 134 may be formed over substantially planar upper surface 120 in second region 118. Dielectric 134 may include, e.g., an oxide, such as silicon oxide. As shown in FIG. 7, dielectric 134 may be planarized to a top surface of set of nitride fins 116 in first region 114. Planarization refers to various processes that make a surface more planar (that is, more flat and/or smooth). Chemical-mechanical-polishing (CMP) is one currently conventional planarization process which planarizes surfaces with a combination of chemical reactions and mechanical forces. Other currently conventional planarization techniques may include: (i) oxidation; (ii) chemical etching; (iii) taper control by ion implant damage; (iv) deposition of films of low-melting point glass; (v) resputtering of deposited films to smooth them out; (vi) photosensitive polyimide (PSPI) films; (vii) new resins; (viii) low-viscosity liquid epoxies; (ix) spin-on glass (SOG) materials; and/or (x) sacrificial etch-back.

Dielectric 134 may be planarized such that dielectric 134 remains disposed between nitride fins of set of nitride fins 116. The planarizing may remove dielectric 134 from second region 118 to expose substantially planar upper surface 120 in the second region 118. That is, during the planarization, dielectric 134 is planarized to nitride layer 110. Therefore, in first region 114, dielectric 134 may be planarized to a top surface nitride fins 116, and in second region 118, dielectric may be planarized to top surface 120 of nitride layer 110.

Figure 8:
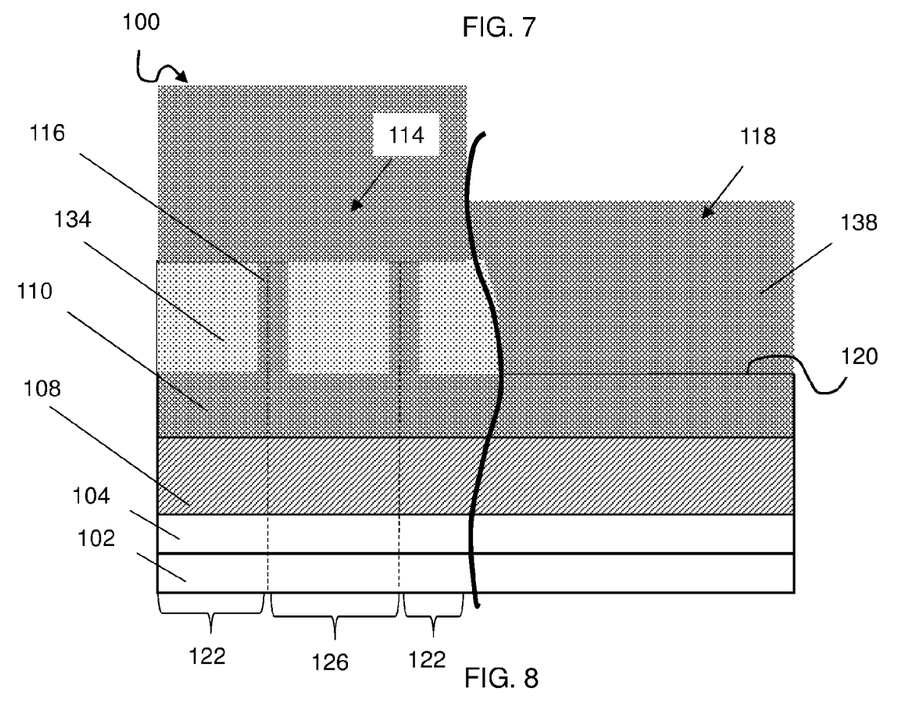
Figure 9:
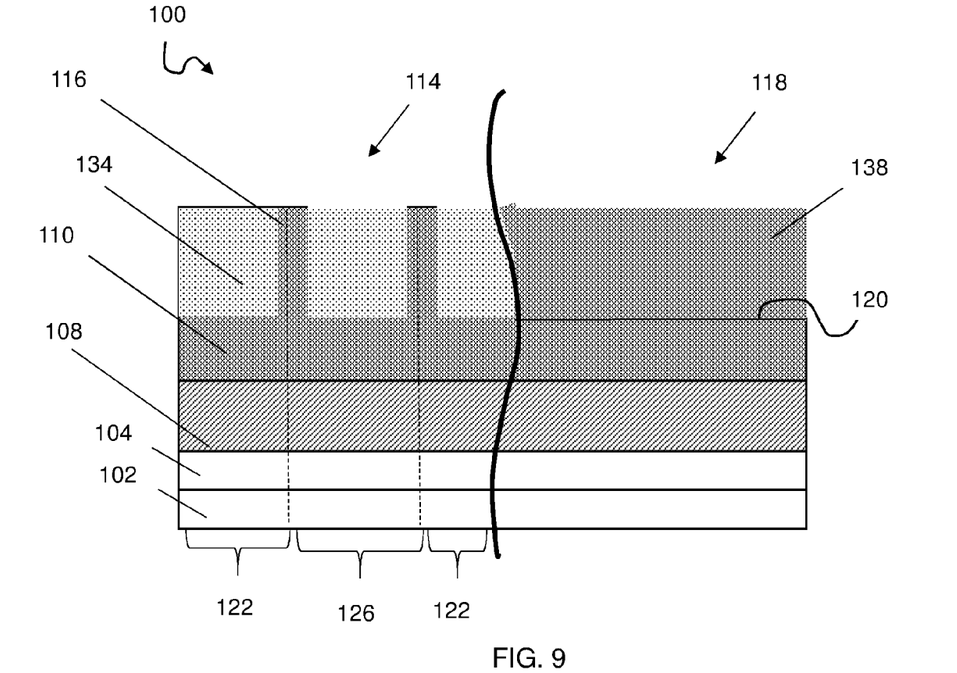

As shown in FIG. 8, another nitride layer 138 may be formed, e.g., deposited, over dielectric 134 and the top surface of set of nitride fins 116 in first region 114. Nitride layer 138 may include any nitride materials used for nitride 110. Additionally, nitride layer 138 may be formed over substantially planar upper surface 120 in second region 118. Nitride layer 138 in first region 118 may be formed to a height that is greater than a height of nitride layer 138 in second region 118 since it is formed from a surface in first region 114 having a greater height than the surface it is formed from in second region 118. As shown in FIG. 9, nitride layer 138 may be planarized such that nitride layer 138 in second region 118 is planar to the top surface of dielectric 134 and set of nitride fins 116 that are disposed in first region 114. Additionally, nitride layer 138 may be planarized such that nitride layer 138 is removed from first region 114.

Figure 10:
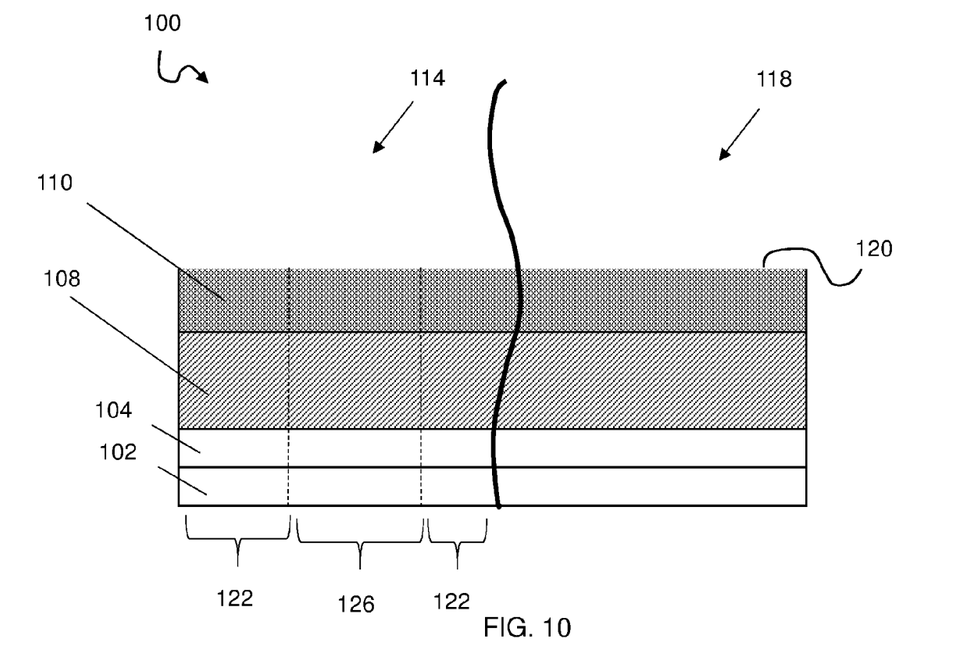

Turning now to FIG. 10, an etching may be performed such that nitride layer 110 in first region 114 is substantially planar with nitride layer 110 in second region 118. The etching may include removing set of nitride fins 116 and dielectric 134 from first region 114. In addition, the etching may include recessing nitride layer 138 to upper surface 120 of nitride layer 110. As a result, nitride layer 110 that remains after this etching is substantially planar and has a substantially even upper surface 120.

The present disclosure prevents gate height loss in second region 118. In conventional techniques for removing nitride fins (similar to nitride fins 116 in first region 114), there may not be any nitride over the gate structure in the second region, or the nitride over gate structure in the second region may be less than that in the first region, thus any polishing that may take place may polish the gate structure in second region 118. As a result, there may be non-uniform gate height between regions. Aspects of the present disclosure allow for uniform gate height between regions, thereby improving device performance.

While not shown herein, IC structure 100 may undergo additional conventional processing such as removal or opening of nitride layer 110 to expose dummy gate structure 108 such that dummy gate structure 108 may be removed and replaced with active gate structure materials, such as gate dielectric layers, work function metal layers, optional barrier layers, and gate conductor layers. In another embodiment, gate structure 108 formed as discussed with respect to FIG. 5 may include an active gate structure and nitride layer 110 may include a gate cap layer formed thereover.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s). "Substantially" refers to largely, for the most part, entirely specified or any slight deviation which provides the same technical benefits of the disclosure.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method of planarizing an integrated circuit structure, the method comprising:
    forming a dielectric over a first nitride layer that is disposed over a substrate, the first nitride layer having a first region including a set of nitride fins and a second region having a substantially planar upper surface;
    planarizing the dielectric to a top surface of the set of nitride fins in the first region and removing the dielectric from the second region to expose the substantially planar upper surface in the second region;
    forming a second nitride layer over the dielectric and the top surface of the set of nitride fins in the first region and over the substantially planar upper surface in the second region;
    planarizing the second nitride layer such that the second nitride layer in the second region is planar with the top surface of the dielectric and the set of nitride fins that are disposed in the first region, and such that the second nitride layer is removed from the first region; and
    performing an etch such that the first nitride layer in the first region is planar with the first nitride layer in the second region.

2. The method of claim 1, wherein the forming of the dielectric includes forming the dielectric to a height greater than the set of nitride fins.

3. The method of claim 1, wherein the planarizing of the dielectric includes planarizing the dielectric such that the dielectric remains disposed between the nitride fins of the set of nitride fins in the first region.

4. The method of claim 1, wherein the forming of the second nitride layer includes forming the second nitride layer in the first region to a height that is greater than a height of the second nitride layer in the second region.

5. The method of claim 1, wherein the performing of the etch includes removing the set of nitride fins and the dielectric from the first region.

6. The method of claim 1, wherein the substrate includes n-type field effect transistor (NFET) regions and p-type field effect transistor (PFET) regions, and further comprising, prior to the forming of the dielectric:
    forming the first nitride layer over a substrate;
    performing a first lithography technique to remove portions of the first nitride layer over the NFET regions of the substrate; and
    performing a second lithographic technique to remove portions of the first nitride layer over the PFET regions of the substrate such that the set of nitride fins remain between NFET regions and PFET regions.

7. The method of claim 6, wherein the set of nitride fins are formed in an overlap region of a mask used in the first lithography technique and a mask used in the second lithography technique.

8. A method of planarizing an integrated circuit structure, the method comprising:
    forming a dielectric over a first nitride layer that is disposed over a substrate, the first nitride layer having a first region including a set of nitride fins and a second region having a substantially planar upper surface;
    planarizing the dielectric with the set of nitride fins such that the dielectric is removed from the second region and remains disposed between the nitride fins of the set of nitride fins in the first region;
    forming a second nitride layer over the set of nitride fins and the dielectric in the first region and over the substantially planar upper surface in the second region;
    planarizing the second nitride layer to the set of nitride fins thereby removing the second nitride layer from the first region; and
    performing an etch to remove the set of nitride fins and the dielectric from the first region and to remove the second nitride layer from the second region such that the first nitride layer in the first region is substantially planar with the first nitride layer in the second region.

9. The method of claim 8, wherein the forming of the dielectric includes forming the dielectric to a height greater than the set of nitride fins.

10. The method of claim 8, the forming of the second nitride layer includes forming the second nitride layer in the first region to a height that is greater than a height of the second nitride layer in the second region.

11. The method of claim 8, wherein the performing of the etch includes removing the set of nitride fins and the dielectric from the first region.

12. The method of claim 8, wherein the substrate includes n-type field effect transistor (NFET) regions and p-type field effect transistor (PFET) regions, and further comprising, prior to the forming of the dielectric:
    forming the first nitride layer over a substrate;
    performing a first lithography technique to remove portions of the first nitride layer over the NFET regions of the substrate; and
    performing a second lithographic technique to remove portions of the first nitride layer over the PFET regions of the substrate such that the set of nitride fins remain between NFET regions and PFET regions.

13. The method of claim 12, wherein the set of nitride fins are formed in an overlap region of a mask used in the first lithography technique and a mask used in the second lithography technique.

14. A method of planarizing an integrated circuit structure, the method comprising:
    forming a dielectric over a first nitride layer that is disposed over a substrate, the first nitride layer include a first region having a set of nitride fins and a second region having a substantially planar upper surface, wherein each fin in the set of nitride fins is disposed between a p-type field effect transistor (PFET) region of a substrate and an n-type field effect transistor (NFET) region of the substrate;
    planarizing the dielectric with the set of nitride fins such that the dielectric is removed from the second region and remains disposed between the nitride fins of the set of nitride fins in the first region;
    forming a second nitride layer over the set of nitride fins and the dielectric in the first region and over the substantially planar upper surface in the second region;
    planarizing the second nitride layer to the set of nitride fins thereby removing the second nitride layer from the first region; and
    performing an etch to remove the set of nitride fins and the dielectric from the first region and to remove the second nitride layer from the second region such that the first nitride layer in the first region is substantially planar with the first nitride layer in the second region.

15. The method of claim 14, wherein the forming of the dielectric includes forming the dielectric to a height greater than the set of nitride fins.

16. The method of claim 14, the forming of the second nitride layer includes forming the second nitride layer in the first region to a height that is greater than a height of the second nitride layer in the second region.

17. The method of claim 14, wherein the performing of the etch includes removing the set of nitride fins and the dielectric from the first region.

18. The method of claim 14, further comprising, prior to the forming of the dielectric:
    forming the first nitride layer over a substrate;
    performing a first lithography technique to remove portions of the first nitride layer over the NFET regions of the substrate; and
    performing a second lithographic technique to remove portions of the first nitride layer over the PFET regions of the substrate such that the set of nitride fins remain between NFET regions and PFET regions.

19. The method of claim 18, wherein the set of nitride fins are formed in an overlap region of a mask used in the first lithography technique and a mask used in the second lithography technique.

* * * * *